United States Patent [19]

Andrulitis et al.

[11] 4,241,493
[45] Dec. 30, 1980

[54] METHOD OF FABRICATING SOLAR CELL MODULES

[76] Inventors: William B. Andrulitis, 8 Friend St., Manchester, Mass. 01944; Steven G. Miles, 16 Oak St., N. Billerica, Mass. 01862; William T. Kurth, 477 Highland St., S. Hamilton, Mass. 01982

[21] Appl. No.: 972,246

[22] Filed: Dec. 22, 1978

[51] Int. Cl.³ .............................................. B01J 17/00
[52] U.S. Cl. ...................................... 29/572; 29/588; 29/589; 136/251; 264/272
[58] Field of Search ............... 29/572, 588, 589; 136/89 EP; 264/272

[56] References Cited

U.S. PATENT DOCUMENTS

| | | | |
|---|---|---|---|
| 3,565,719 | 2/1971 | Webb | 29/589 |
| 3,849,880 | 11/1974 | Haynos | 29/572 |
| 3,957,537 | 5/1976 | Baskett | 29/572 |
| 4,009,054 | 2/1977 | Gochermann | 29/572 |
| 4,043,027 | 8/1977 | Birchler | 29/588 |
| 4,067,764 | 1/1978 | Walker | 136/89 H |
| 4,083,097 | 4/1978 | Anagnostou | 29/572 |
| 4,084,985 | 4/1978 | Evans | 29/572 |
| 4,154,998 | 5/1979 | Luft | 29/572 |

*Primary Examiner*—W. C. Tupman
*Attorney, Agent, or Firm*—Joseph J. Dvorak

[57] ABSTRACT

The solar cell module of this invention is fabricated by placing an array of solar cells in a suitable mold having a bottom surface, an entry port and an exit port. A light transparent superstrate effectively serves as the top for the mold and is placed over the array of solar cells in the mold. The superstrate is spaced from the array such that the superstrate does not come in contact with the top surface of any of the cells or interconnectors of the solar cell array. Clamp means are provided to hold the superstrate in position while encapsulant is pumped into the mold under pressure through the inlet port in an amount sufficient to fill the mold. Thereafter the assembly can be placed in an oven and heated for a time sufficient to cure the encapsulant and bond the materials to each other.

6 Claims, 4 Drawing Figures

METHOD OF FABRICATING SOLAR CELL MODULES

BACKGROUND OF THE INVENTION

1. Field of the Invention

This invention relates generally to solar cell modules. More particularly, this invention relates to an improved method for fabricating a solar cell module.

2. Background of the Invention

In general, a solar cell module consists of an array of individual solar cells electrically interconnected and housed in a protective and supporting enclosure.

Typically the individual solar cells of the module are arranged in columns and rows and are interconnected by flexible interconnector means which are positioned so as to connect the cells in the requisite series and/or parallel circuit arrangement. The circuit arrangement, of course, depends upon the desired output voltage and current at the module peak power point. Flexibility in the interconnectors permits slight movement of the individual cells in the array without breaking the electrical connections.

A protective enclosure or housing is used in order to protect the solar cells and the interconnecting means from degrading as a result of environmental conditions, such as humidity, pollutants, wind, snow and ice damage and the like. Typically the housing consists of a rigid support structure on which the solar cells are mounted and a top light transparent encapsulant through which solar radiation passes before impinging on the active solar cells. Frequently, a rigid light transparent top member, as added protection, also is provided since the encapsulant surface can be damages by animals, hail, etc. More recently there has been a tendency to employ an optically clear superstrate to not only protect the solar cell array against environmental hazards but also to serve as the structural support for the array. Obviously a solar cell array having a single material which serves both as a supporting surface and as a protective packaging material for the solar cells offers significant commercial advantages; however, bonding the solar cells to a rigid light transparent superstrate has not been without significant technical problems. For example, since the light transparent superstrate consists of a substantially flat planar sheet of rigid, light transparent, electrically nonconducting material, such as glass, an adhesive is required to mount an array of solar cells on the bottom surface of such a superstrate. For this purpose, electrically nonconductive, light transparent plastic resins such as silicone rubbers and the like, which are employed as encapsulants for all manner of electronic packages, are used as adhesives. As will be appreciated, the height of the electrodes on the top surface of each of the solar cells in the array can vary one from the other. The height of the interconnectors, as measured from the top surface of the solar cells, may vary also. Additionally, slight movement of encapsulated cells may occur during use of the module. Consequently, it is especially important to align the cells during encapsulation as uniformly as possible to avoid creation of stresses, especially where an electrode or interconnector may contact the superstrate. Top alignment of the cells and interconnectors has been virtually impossible in the past to achieve, and instead a considerable thickness of encapsulant is employed in bonding the solar cell array to the superstrate. Use of large amounts of encapsulate is costly. Additionally, it is absolutely necessary to assure that the encapsulant is free of air bubbles and the like which would tend to cause degradation of the module when exposed to solar energy.

SUMMARY OF THE INVENTION

Broadly speaking, the present invention is concerned with a method of forming a solar cell module comprising a light transparent superstrate and having a solar cell array mounted on the bottom of the superstrate by means of a light transparent encapsulant and which method is simple, reproducible, relatively rapid and utilizes a minimum amount of encapsulant consistent with the avoidance of point contact stresses.

In brief, the solar cell module of this invention is fabricated by placing an array of solar cells in a suitable mold having a bottom surface, an entry port and an exit port. A light transparent superstrate effectively serves as the top for the mold and is placed over the array of solar cells in the mold. The superstrate is spaced from the array such that the superstrate does not come in contact with the top surface of any of the cells or interconnectors of the solar cell array. Clamp means are provided to hold the superstrate in position while encapsulant is pumped into the mold under pressure through the inlet port in an amount sufficient to fill the mold. Thereafter the assembly can be placed in an oven and heated for a time sufficient to cure the encapsulant and bond the materials to each other.

These and other features of the invention will be readily apparent from the following description which follows and from the accompanying drawings wherein like numerals are used throughout to identify like parts.

DETAILED DESCRIPTION OF THE DRAWINGS

DETAILED DESCRIPTION OF THE INVENTION

Figure 1:
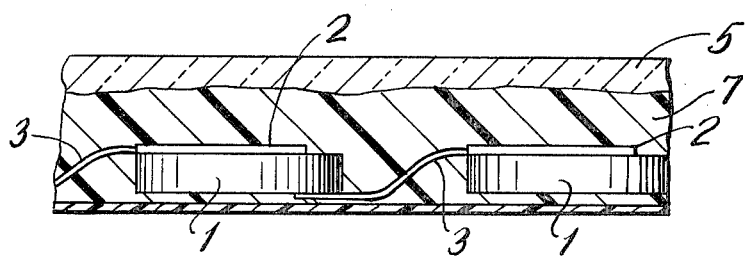
FIG. 1 is a fragmentary diagrammatic side elevation illustrating a photovoltaic device prepared in accordance with this invention.

Referring now to FIG. 1, there is shown a solar cell module including a plurality of solar cells 1 which are suitably arrayed, for example, in linear rows. Each solar cell is provided with the usual bottom electrode covering the entire surface of the solar cells 1 and a top electrode comprising a plurality of exceedingly thin electric conductors connected in the usual manner to a main electrical conductor or bus bar 2. The solar cells are interconnected by means of strip shaped interconnector means 3. Thus, the bottom electrode from one cell is connected to the main or bus bar electrode 2 of the next adjacent cell by means of interconnectors 3.

The plurality of solar cells 1 arrayed and interconnected in a suitable fashion is supported on the bottom surface of superstrate 5. Superstrate 5 is an electrically nonconductive rigid light transparent material which can be polymeric or glass or the like. Preferably the superstrate 5 is a low iron, high transmission, tempered glass such as Sunadex glass sold by ASG Inc. of Kingsport, Tennessee.

The solar cells 1 are encapsulated in and bonded to the superstrate 5 by a suitable light transparent electrically nonconductive encapsulating material 7, such as those encapsulating materials generally known to the electronics and solar cell industry. Such encapsulants include silicone rubbers and the like.

Figure 2:
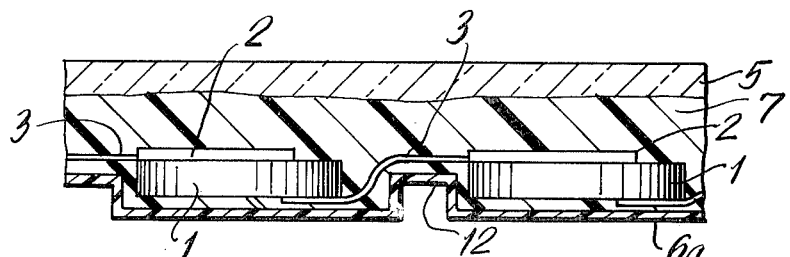
FIG. 2 is a fragmentary diagrammatic side elevation of yet another photovoltaic device prepared in accordance with the present invention.

Over the back surface of the module and at least in the land areas between the solar cells is a light scattering surface 6 which serves to reflect incident solar radiation that impinges on the land areas between the cells in a diffuse manner such that much of the light falling on the land areas is internally reflected through the encapsulant and glass back down toward the surface of the solar cell. This back light scattering film may be merely white paint; however, in the practice of the present invention, it is particularly preferred that a thin sheet of white plastic film is used; indeed, generally available films such as those sold under the trademarks Mylar and Tedlar by duPont, Wilmington, Delaware, and Kodar by Eastman Kodak, Rochester, New York, are preferred light scattering films. It should be noted that in the embodiment shown in FIG. 2, the white sheet material 6a is thermoformed so as to provide raised land areas between the individual solar cells, thereby reducing the amount of encapsulant material 7 employed in bonding and optically coupling the cells to the light diffusing surface. This backing member 6, or the thermoformed backing member 6a, optionally can have a texturized surface, at least in the land areas, thereby further increasing the scattering of light impinging upon those land areas. This surface texturing can be achieved, for example, by sand blasting, sanding, intentional faceting, and the like.

In the past, solar cell modules of the type herein described were prepared by first filling a mold with a suitable encapsulant and thereafter floating an array of solar cells in the encapsulant. The array thereafter would sink into the encapsulant and be covered by it. Finally, a rigid superstrate was placed on top of the still fluid encapsulant, and the assembly finally was allowed to cure at ambient conditions over time periods ranging from about 12 to 48 hours. Floating the cells in the encapsulant did not permit alignment of the top surface of the cells to the superstrate. Consequently, a relatively large amount of encapsulant was employed to insure an adequate thickness of the encapsulant, particularly in the area between the top surface of the individual solar cells and the rigid top surface member, thereby circumventing the formation of contact stress points.

The present invention provides an improved method for assembling a solar module which minimizes the amount of encapsulant employed while avoiding contact stress points in the device. The present process also avoids long processing times, thereby enhancing its commercial significance.

Figure 3:
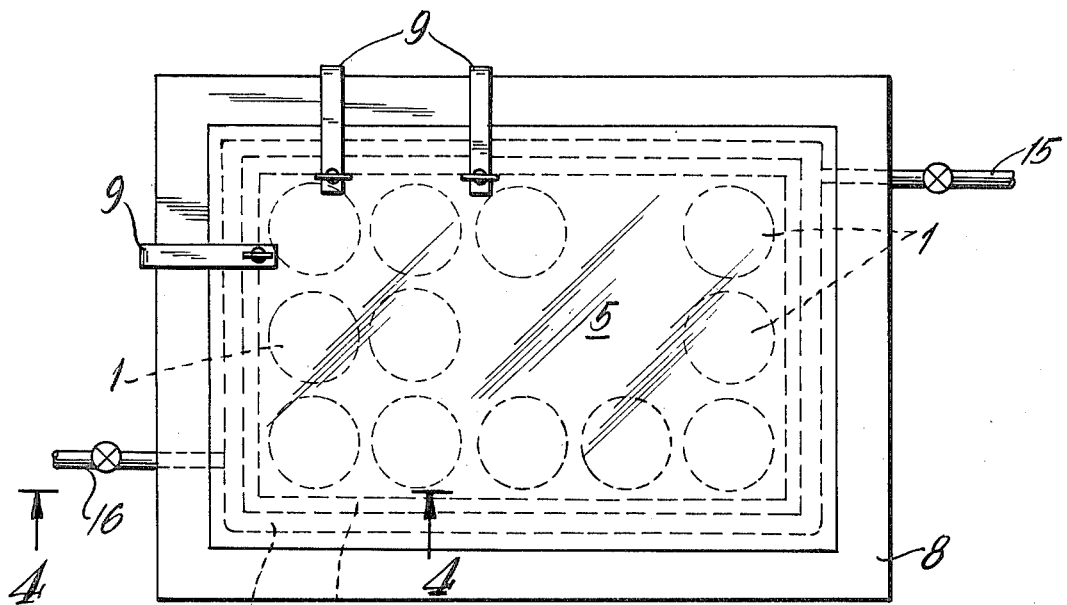
FIG. 3 is a diagrammatic top plan view illustrating the method of the present invention.
Figure 4:
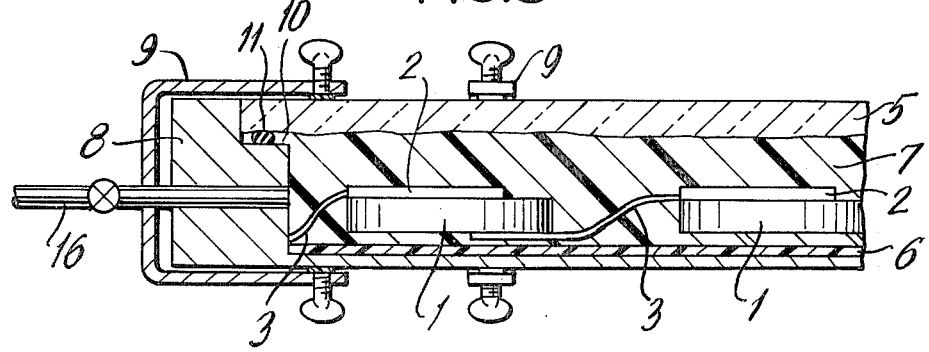
FIG. 4 is an enlarged sectional view taken along line 4—4 of FIG. 3.

The method of the present invention is shown generally in FIGS. 3 and 4. Basically, a mold 8 is provided which has a generally rectangular recessed area of a depth equal to the ultimate thickness of the solar cell module. The length and width of the recess in the mold is substantially equal to the length and width of the about-to-be-fabricated solar cell module as well. In the preferred embodiment of the present invention, the mold is first lined with a thin light scattering material such as the Mylar, Tedlar or Kodar films referred to above. Indeed, it is particularly preferred to use a thermoformed Kodar film having raised land areas (shown as reference numeral 12 in FIG. 2).

After arranging the white backing member with the white surface facing upward in the mold, a template (not shown) having a plurality of circular openings therein corresponding to the approximate location of each solar cell in a solar cell array is placed in the mold. Thereafter a thin film of adhesive, such as a heat curable encapsulant, is placed at each ultimate solar cell location, i.e., at each opening in the template. Typically the adhesive employed will be the same material as the encapsulant material used in fabricating the module. Thus, silicone rubber encapsulants, such as those sold under the tradenames GE615 and DC184 by General Electric Company, Waterford, New York, and Dow Corning Corporation, Midland, Michigan, respectively, can be used as the adhesive. Basically, the adhesive assures that the cells of the array remain in a substantially fixed position during the subsequent processing steps.

In any event and as indicated, the amount of adhesive used is just that sufficient to bond each solar cell of the array to the backing member. Typically, for example, the amount of adhesive applied will be in the range of about 4 to 6 grams of adhesive per solar cell. Generally, it is applied as a drop or globule in each opening provided in the template. It does not have to be painted or spread out for reasons which will become apparent subsequently.

As will be appreciated, in the event that a flat piece of light diffusing material is not used, but rather the thermoformed material 6a is employed and placed in the mold, then the template is not required nor is the adhesive since the wells defined by the raised land areas tend, during subsequent processing, to limit the movement of the cells placed thereon. Optionally the adhesive is used and the requisite amount of adhesive is merely placed in each of the wells defined by the raised land areas provided in the thermoformed backing member 6a.

It should be noted that in those instances when a template is used it is removed after locating and placing on the white backing member the requisite amount of adhesive.

After placement of the adhesive, and removal of the template in appropriate instances, the array of solar cells previously interconnected is placed in the mold on the adhesives. Then pressure is applied to the solar cells in an amount sufficient to assure the flow of adhesive over the entire back surface of each solar cell of the solar cell array. Generally from about 0.4 lb/cell to about 0.5 lb/cell is sufficient pressure to apply. Preferably the requisite pressure is applied by placing a weighted fixture on the array. The fixture is such that the weight is distributed and applied to each cell of the array. Thereafter it takes from about 30 to 45 minutes for the solar cells to be bonded sufficiently to the light diffusing backing member. If a weighted fixture is employed, it is removed after fixing the position of the cells in the mold on the back film. Then a rigid, light transparent superstrate 5 such as a glass plate is placed over the solar cell array and serves as the mold cover. Superstrate 5 is supported by a shoulder 10 in the mold 8 and resilient gasketing material such as an O-ring 11 optionally and preferably is provided as shown to assure that a tight seal is formed between the cover glass and the mold. Preferably clamping means is employed to hold the superstrate 5 in place on the mold. Spring-loaded clamps, toggle clamps and the like are among suitable clamping means which can be made integral with the mold. Optionally, and as is shown in FIG. 4, a C-clamp 9, for example, is employed.

Having placed the superstrate material firmly in place, the space between the backing member in the mold and the surface cover is then filled with encapsulant by attaching a source of encapsulant to inlet port 15. Air in the mold is permitted to escape via outlet port 16. Preferably the encapsulant is the same light transparent silicone rubber encapsulant employed as the adhesive. Indeed, it is particularly preferred that the adhesive be the encapsulant heat curable material sold by General Electric Company, Waterford, New York, under the tradename GE615. This encapsulant material is pumped under pressure forcing the air out of the mold and filling it completely with encapsulant. Typically pressures in the range of about 2 psi to 5 psi are employed. After filling the mold with encapsulant material, the entire assembly is placed in an oven and cured. Curing time and temperature, of course, depend upon the encapsulant material employed. With one of the aforementioned encapsulants, such as GE615, the assembly can be cured in time periods of from about 45 to 75 minutes at temperatures in the range of 60° C. to 70° C.

Thereafter the assembly is allowed to cool, removed from the oven and the module is removed from the mold.

It should be readily apparent that the foregoing technique permits the spacing of the cells from the top rigid superstrate at a minimum distance necessary to prevent pressure points developing by virtue of potential contact of the top of the cells of the interconnects with the rigid member. Applying pressure and adhesively bonding each of the solar cells in the array to the top of the light diffusing member placed in the bottom of the mold assures substantial alignment of the cells in the array in substantially coplanar fashion, thus also contributing to the avoidance of pressure points. Pumping the encapsulant to the mold during assembly of the solar cell module of the present invention assures dispelling of air and assures optical coupling of the white light scattering surface of the backing member with the solar cells. Optical coupling is necessary in order to take advantage of the redirection of light from the land areas between the cells onto the top of the solar cells where the surface is active. Additionally, dispelling of air is important in order to avoid degradation or possible delamination of the assembly when in operation because of the thermal differences in properties between each of the materials and the air spaces. Pumping the encapsulant into a controlled minimum volume decreases the amount of encapsulant needed in module construction yet assures that the cells are adhesively bonded to the superstrate. Finally, modules prepared in accordance with the present invention can be assembled rapidly both by automatic and semi-automatic batch techniques, thereby offering further economic advantages to the method disclosed herein.

Having now fully described this invention, it will be apparent to one with ordinary skill in the art that many changes and modifications can be made thereto without departing from the spirit or scope of the invention as set forth herein.

What is claimed is:

1. A method of fabricating a solar cell module having a rigid, light transparent superstrate and a plurality of solar cells arrayed on the bottom surface of such superstrate which comprises:
    preparing an array of solar cells electrically interconnected one to the other in serial and/or parallel fashion;
    placing said array of solar cells in a mold, said mold having an inlet port and an outlet port and a depth substantially equal to the thickness of the module being formed;
    substantially limiting the movement of said array placed in said mold;
    placing and securing a rigid light transparent electrically nonconductive superstrate on top of said mold, said superstrate being spaced from the top of the array, whereby a cavity is defined between said rigid transparent member and the bottom of said mold;
    pumping an encapsulant through the inlet port of said mold until all the air is expelled from the cavity defined by said superstrate and the bottom of mold; and
    thereafter curing said encapsulant, thus bonding said superstrate to said array; then removing the module, including said superstrate, from the mold.

2. The method of claim 1 wherein the movement of said array is substantially limited by first lining said mold with a backing sheet for said module and adhesively bonding said array to said backing sheet.

3. The method of claim 2 wherein said backing sheet is a film of an optically white sheet material and said array is bonded to said backing sheet by applying an adhesive to the top surface of said white sheet material at least at locations corresponding to the location of the solar cells in said array; placing said array on top of said resin adhesive; and thereafter applying sufficient pressure so as to cause the adhesive to flow completely over the surface of the bottom of each of the plurality of solar cells in said array.

4. The method of claim 1 wherein the movement of said array is substantially limited by first lining said mold with a backing sheet having raised land areas at locations between each cell in the array whereby said raised land areas limit the movement of said array in said mold.

5. A method of fabricating a solar cell module having a rigid light transparent superstrate and a plurality of solar cells arrayed on the bottom surface of said superstrate comprising:
    preparing an array of solar cells electrically interconnected one to the other in serial and/or parallel fashion;
    placing said array of solar cells in a mold, said mold having an inlet port and an outlet port and a depth substantially equal to the thickness of the module being formed;
    placing an optically white backing sheet in said mold;
    placing an adhesive at least at each location corresponding to the location of the solar cells in the array in an amount sufficient to form a thin film of adhesive on the back of each of said cells of the array and to bond the cells to the backing sheet whereby the movement of cells in the mold is substantially limited;
    placing said array on said adhesive;
    applying pressure to said array in an amount and for a time sufficient to bond said array to said backing sheet;

placing and securing a rigid light transparent electrically nonconductive superstrate on top of said mold, said superstrate being spaced from the top of the array, whereby a cavity is defined between said rigid transparent member and the bottom of said mold;

pumping an encapsulant through the inlet port of said mold until all the air is expelled from the cavity defined by said superstrate and the bottom of mold; and thereafter curing said encapsulant, thus bonding said superstrate to said array; then removing the module, including said superstrate, from the mold.

6. A method of fabricating a solar cell module having a rigid light transparent superstrate and a plurality of solar cells arrayed on the bottom surface of said superstrate comprising:

preparing an array of solar cells electrically interconnected one to the other in serial and/or parallel fashion;

placing said array of solar cells in a mold, said mold having an inlet port and an outlet port and a depth substantially equal to the thickness of the module being formed;

placing an optically white backing sheet in said mold, said backing sheet having raised land areas at locations between each cell in the array whereby said land areas limit the movement of said array in said mold;

placing said array in said mold on said backing sheet so that the raised land areas thereof are located between the cells of the array;

placing and securing a rigid light transparent electrically nonconductive superstrate on top of said mold, said superstrate being spaced from the top of the array, whereby a cavity is defined between said rigid transparent member and the bottom of said mold;

pumping an encapsulant through the inlet port of said mold until all the air is expelled from the cavity defined by said superstrate and the bottom of mold; and thereafter curing said encapsulant, thus bonding said superstrate to said array; then removing the module, including said superstrate, from the mold.

* * * * *